US012329035B2

(12) United States Patent
Hou et al.

(10) Patent No.: US 12,329,035 B2
(45) Date of Patent: Jun. 10, 2025

(54) BULK ACOUSTIC WAVE RESONATOR WITH IMPROVED STRUCTURES

(71) Applicant: Global Communication Semiconductors, LLC., Torrance, CA (US)

(72) Inventors: Liping D. Hou, Torrance, CA (US); Shing-Kuo Wang, Torrance, CA (US)

(73) Assignee: GLOBAL COMMUNICATION SEMICONDUCTORS, LLC, Torrance, CA (US)

(*) Notice: Subject to any disclaimer, the term of this patent is extended or adjusted under 35 U.S.C. 154(b) by 779 days.

(21) Appl. No.: 17/680,231

(22) Filed: Feb. 24, 2022

(65) Prior Publication Data
US 2022/0416149 A1 Dec. 29, 2022

Related U.S. Application Data

(60) Provisional application No. 63/216,486, filed on Jun. 29, 2021.

(51) Int. Cl.
*H01L 41/08* (2006.01)
*H03H 9/02* (2006.01)
*H03H 9/17* (2006.01)
*H10N 30/00* (2023.01)

(52) U.S. Cl.
CPC ...... *H10N 30/708* (2024.05); *H03H 9/02031* (2013.01); *H03H 9/173* (2013.01); *H03H 9/175* (2013.01); *H03H 9/176* (2013.01)

(58) Field of Classification Search
CPC .. H10N 30/708; H03H 9/02031; H03H 9/173; H03H 9/175; H03H 9/176
See application file for complete search history.

(56) References Cited

U.S. PATENT DOCUMENTS

| | | |
|---|---|---|
| 4,320,365 A | 3/1982 | Black et al. |
| 4,456,850 A | 6/1984 | Inoue et al. |
| 5,448,014 A | 9/1995 | Kong et al. |

(Continued)

FOREIGN PATENT DOCUMENTS

| | | |
|---|---|---|
| JP | 2016140053 A | 8/2016 |
| TW | 200610266 A | 3/2006 |
| WO | WO2020132997 A1 | 7/2020 |

OTHER PUBLICATIONS

Global Communication Semiconductors, Inc., Restriction Election, U.S. Appl. No. 16/455,627, filed Aug. 19, 2022, 7 pgs.

(Continued)

*Primary Examiner* — Bryan P Gordon
(74) *Attorney, Agent, or Firm* — Morgan, Lewis & Bockius LLP

(57) ABSTRACT

A bulk acoustic wave resonator includes a substrate, and a stack that is supported by the substrate. The stack includes a first electrode, a multilayer buffer, a piezoelectric layer, and a second electrode. The multilayer buffer is disposed between the first electrode and the piezoelectric layer, and the piezoelectric layer is disposed between the multilayer buffer and the second electrode. The multilayer buffer includes two or more pairs of alternating layers. A first pair of the two or more pairs include a first layer of crystalline material having a first lattice constant, and a second layer of crystalline material having a lattice constant that is distinct from the first lattice constant.

28 Claims, 6 Drawing Sheets

(56) References Cited

U.S. PATENT DOCUMENTS

| | | | |
|---|---|---|---|
| 5,578,974 A | 11/1996 | Yang et al. | |
| 5,587,620 A | 12/1996 | Ruby et al. | |
| 5,873,153 A | 2/1999 | Ruby et al. | |
| 5,894,647 A | 4/1999 | Lakin | |
| 6,060,818 A | 5/2000 | Ruby et al. | |
| 6,150,703 A | 11/2000 | Cushman et al. | |
| 6,262,637 B1 | 7/2001 | Bradley et al. | |
| 6,278,342 B1 | 8/2001 | Ella | |
| 6,424,237 B1 | 7/2002 | Ruby et al. | |
| 6,693,500 B2 | 2/2004 | Yang et al. | |
| 6,828,713 B2 | 12/2004 | Bradley et al. | |
| 6,842,088 B2 | 1/2005 | Yamada et al. | |
| 7,327,073 B2 | 2/2008 | Shearer et al. | |
| 7,345,410 B2 | 3/2008 | Grannen et al. | |
| 7,408,428 B2 | 8/2008 | Larson, III | |
| 7,522,018 B2 | 4/2009 | Milsom et al. | |
| 7,737,806 B2 | 6/2010 | Taniguchi et al. | |
| 7,795,781 B2 | 9/2010 | Barber et al. | |
| 8,330,325 B1 | 12/2012 | Burak et al. | |
| 8,350,445 B1 | 1/2013 | Shirakawa et al. | |
| 8,896,395 B2 | 11/2014 | Burak et al. | |
| 9,197,185 B2 | 11/2015 | Zou et al. | |
| 9,246,079 B2 | 1/2016 | Umeda et al. | |
| 9,246,473 B2 | 1/2016 | Burak et al. | |
| 9,374,059 B1 | 6/2016 | Hurwitz et al. | |
| 9,401,692 B2 | 7/2016 | Burak | |
| 9,479,139 B2 | 10/2016 | Ruby et al. | |
| 9,608,589 B2 | 3/2017 | Grannen et al. | |
| 9,634,643 B2 | 4/2017 | Shin et al. | |
| 9,842,980 B2 | 12/2017 | Park et al. | |
| 10,079,334 B2 | 9/2018 | Moulard et al. | |
| 10,298,197 B2 | 5/2019 | Lee et al. | |
| 10,601,391 B2 | 3/2020 | Stokes et al. | |
| 11,424,729 B2 | 8/2022 | Lee et al. | |
| 11,736,088 B2 | 8/2023 | Stokes et al. | |
| 11,764,750 B2 | 9/2023 | Hou et al. | |
| 11,817,839 B2 | 11/2023 | Wang et al. | |
| 11,909,373 B2 | 2/2024 | Wang et al. | |
| 2005/0012568 A1 | 1/2005 | Aigner | |
| 2005/0179508 A1 | 8/2005 | Sato | |
| 2006/0145785 A1 | 7/2006 | Ishii et al. | |
| 2007/0001544 A1 | 1/2007 | Geefay | |
| 2008/0111452 A1 | 5/2008 | Koizumi et al. | |
| 2008/0292127 A1 | 11/2008 | Ruile et al. | |
| 2010/0019866 A1 | 1/2010 | Hara et al. | |
| 2010/0148637 A1 | 6/2010 | Satou | |
| 2011/0080233 A1 | 4/2011 | Petit et al. | |
| 2011/0227671 A1 | 9/2011 | Zhang | |
| 2011/0266917 A1 | 11/2011 | Metzger et al. | |
| 2011/0298564 A1 | 12/2011 | Iwashita et al. | |
| 2012/0056694 A1* | 3/2012 | Pang | H03H 9/02149 333/187 |
| 2012/0205754 A1 | 8/2012 | Iwamoto | |
| 2013/0049545 A1 | 2/2013 | Zou et al. | |
| 2013/0057115 A1 | 3/2013 | Saito et al. | |
| 2013/0140959 A1 | 6/2013 | Shin et al. | |
| 2013/0181579 A1* | 7/2013 | Shin | H10N 30/40 310/346 |
| 2014/0036340 A1* | 2/2014 | Hong | G02B 26/001 359/290 |
| 2014/0117815 A1 | 5/2014 | Bi et al. | |
| 2014/0125203 A1 | 5/2014 | Choy et al. | |
| 2014/0354109 A1* | 12/2014 | Grannen | H03H 9/171 310/311 |
| 2016/0065171 A1 | 3/2016 | Ruby et al. | |
| 2016/0294354 A1 | 10/2016 | Saijo et al. | |
| 2016/0352309 A1 | 12/2016 | Xu et al. | |
| 2017/0077385 A1 | 3/2017 | Stokes et al. | |
| 2017/0149405 A1 | 5/2017 | Kishimoto | |
| 2017/0338399 A1 | 11/2017 | Kim et al. | |
| 2018/0138885 A1 | 5/2018 | Stokes et al. | |
| 2019/0149129 A1 | 5/2019 | Ueda | |
| 2019/0356293 A1 | 11/2019 | Kim et al. | |
| 2019/0379344 A1 | 12/2019 | Wang et al. | |
| 2020/0028482 A1 | 1/2020 | Hou et al. | |
| 2020/0220520 A1 | 7/2020 | Stokes et al. | |
| 2020/0235718 A1 | 7/2020 | Modarres-Zadeh et al. | |
| 2020/0313648 A1 | 10/2020 | Wang et al. | |
| 2020/0389150 A1 | 12/2020 | Wang et al. | |
| 2021/0006220 A1 | 1/2021 | Schiek et al. | |
| 2021/0099156 A1 | 4/2021 | Kirkendall et al. | |
| 2021/0111693 A1 | 4/2021 | Hou et al. | |
| 2021/0111699 A1 | 4/2021 | Hou et al. | |
| 2021/0111701 A1 | 4/2021 | Hou et al. | |
| 2021/0111702 A1 | 4/2021 | Wang et al. | |
| 2021/0143792 A1 | 5/2021 | Pollard | |
| 2021/0250012 A1 | 8/2021 | Hou et al. | |

OTHER PUBLICATIONS

Global Communications Semiconductors, Inc., U.S. Notice of Allowance, U.S. Appl. No. 17/240,943, filed Sep. 27, 2024, 20 pgs.
Working principles and Applications of SAW/FBAR Devices, Taiyo Yuden Navigator, Oct. 2017, 6 pqs.
"Yoo et al., Spurious Resonances and Modelling of Composite Resonators,""Department of Physics, The Catholic University of America, Washington, D.C., ©1983 IEEE, 3 pgs.".
"Yoo et al., Spurious Resonances in Bulk Acoustic Wave Resonators,""Department of Physics, The Catholic University of America, Washington, D.C., ©1982 IEEE, 1982 Ultrasonics Symposium, 4 pgs.".
Stokes, Notice of Allowance, U.S. Appl. No. 15/789,109, filed Nov. 14, 2019, 11pgs.
Wang, Office Action, U.S. Appl. No. 16/368,754, filed Jul. 13, 2022, 7pgs.
Wang, Office Action, U.S. Appl. No. 17/002,498, filed Jul. 12, 2022, 12pgs.
Global Communication Semiconductors, Inc., CN Office Action, Chinese Application No. 201711127532.1, Nov. 22, 2022, 23 pgs.
Global Communication Semiconductors, Inc., U.S. Non-Final Office Action, U.S. Appl. No. 17/071,831, filed Jul. 17, 2023, 12 pgs.
Global Communication Semiconductors, Inc., U.S. Non-Final Office Action, U.S. Appl. No. 16/455,627, filed Dec. 20, 2022, 8 pgs.
Global Communication Semiconductors, Inc., Restriction Election, U.S. Appl. No. 17/071,836, filed Jun. 21, 2023, 7 pgs.
Global Communication Semiconductors, Inc., Restriction Election, U.S. Appl. No. 17/071,810, filed Aug. 9, 2023, 7 pgs.
Global Communication Semiconductors, Inc., Restriction Election, U.S. Appl. No. 17/240,943, filed Apr. 10, 2024, 7 pgs.
Global Communication Semiconductors, Inc., U.S. Non-Final Office Action, U.S. Appl. No. 16/820,625, filed Nov. 14, 2022, 10 pgs.
Global Communication Semiconductors, Inc., U.S. Non-Final Office Action, U.S. Appl. No. 17/071,836, filed Aug. 1, 2023, 13 pgs.
Global Communication Semiconductors, Inc., U.S. Final Office Action, U.S. Appl. No. 17/002,498, filed Jun. 7, 2023, 16 pgs.
Global Communication Semiconductors, Inc., U.S. Final Office Action, U.S. Appl. No. 17/071,836, filed Feb. 28, 2024, 17 pgs.
Global Communication Semiconductors, Inc., U.S. Notice of Allowance, U.S. Appl. No. 16/820,625, filed Apr. 5, 2023, 9 pgs.
Global Communication Semiconductors, Inc., U.S. Notice of Allowance, U.S. Appl. No. 17/071,831, filed Jan. 5, 2024, 8 pgs.
Global Communication Semiconductors, Inc., U.S. Notice of Allowance, U.S. Appl. No. 17/071,810, filed Jan. 23, 2024, 14 pgs.
Global Communications Semiconductors, Inc., U.S. Non-Final Office Action, U.S. Appl. No. 17/071,836, filed Aug. 12, 2024, 20 pgs.

* cited by examiner

BULK ACOUSTIC WAVE RESONATOR WITH IMPROVED STRUCTURES

RELATED APPLICATIONS

This application claims priority to U.S. Provisional Patent Application No. 63/216,486, filed Jun. 29, 2021, which is hereby incorporated by reference in its entirety.

TECHNICAL FIELD

The disclosed embodiments relate generally to bulk acoustic wave resonators, and in particular, to a multilayer buffer for improved bulk acoustic resonators.

BACKGROUND

Bulk acoustic wave (BAW) resonators are widely used in RF filters in mobile devices due to their compact size and high performance. A BAW resonator typically includes a piezoelectric thin film layer between a bottom electrode and a top electrode. When an oscillating electrical signal is applied between the top and bottom electrodes, the piezoelectric thin film layer converts the oscillating electrical signal into bulk acoustic waves. The resonance frequency of the BAW resonator is mainly determined by the acoustic velocity, the thickness of the piezoelectric layer and those of the electrodes. Piezoelectric thin film materials used for BAW devices include ScAlN, AlN, ZnO, and PZT. The performance of BAW resonators depends heavily on the quality of the piezoelectric films therein.

SUMMARY

Bulk acoustic wave (BAW) resonators using ScAlN as piezoelectric material can provide high coupling coefficients for wide band applications. The coupling coefficient of a BAW resonator increases with increasing Scandium (Sc) composition (e.g., concentration) in the ScAlN piezoelectric material. However, deposition of ScAlN piezoelectric material with high Scandium (Sc) composition directly on a bottom electrode of a BAW resonator results in poor crystalline quality of the piezoelectric material. In some cases, the crystalline quality of the piezoelectric material can be improved with the inclusion of a single layer buffer composed of AlN. However, this approach lowers the coupling coefficient of the BAW resonator, thereby defeating the purpose of using a high Sc composition in the ScAlN piezoelectric material.

The BAW resonators described herein include a superlattice buffer that contains alternating AlN and SLAlN layers disposed between a bottom electrode and the piezoelectric material of a BAW resonator to improve the crystalline quality of a SLAlN piezoelectric material with high Sc composition, thereby providing BAW resonators with a high coupling coefficient.

According to some embodiments, a bulk acoustic resonator includes a substrate having an acoustic reflector or a cavity, and a stack that is supported by the substrate. The stack includes a first electrode, a multilayer buffer, a piezoelectric layer, and a second electrode. The multilayer buffer is disposed between the first electrode and the piezoelectric layer and the piezoelectric layer is disposed between the multilayer buffer and the second electrode. The multilayer buffer includes two or more pairs of alternating layers. A first pair of the two or more pairs includes a first layer of crystalline material having a first lattice constant, and a second layer of crystalline material having a lattice constant that is distinct from the first lattice constant.

In some embodiments, the bulk acoustic resonator includes a second pair of the two or more pairs in the multilayer buffer. The second pair includes a third layer of crystalline material that has the first lattice constant and a fourth layer of crystalline material that has a lattice constant that is different from the first lattice constant. The second layer of crystalline material is disposed between the first layer of crystalline material and the third layer of crystalline material, and the third layer of crystalline material is disposed between the second layer of crystalline material and the fourth layer of crystalline material.

In some embodiments, the multilayer buffer further includes additional pairs of alternating layers of crystalline materials (e.g., additional pairs of alternating layers of crystalline materials that are disposed between the first pair of alternating layers and the second pair of alternating layers).

In some embodiments, the multilayer buffer further includes a base layer of crystalline material that is disposed between the first electrode and the first layer of crystalline material, and the base layer of the multilayer buffer has a lattice constant that is different from the first lattice constant.

In some embodiments, the bulk acoustic resonator includes a seed layer between the cavity and the first electrode, wherein the seed layer includes one or more sub-layers of AlN and/or one or more sub-layers of ScAlN.

In some embodiments, the bulk acoustic resonator includes an acoustic reflector (e.g., a multi-layer acoustic mirror) in lieu of the cavity. The acoustic reflector is supported by the substrate, for example positioned between the substrate and the first electrode, and if a seed layer is included (e.g., below the first electrode), the acoustic reflector is positioned between the substrate and the seed layer.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

Figure 1A:
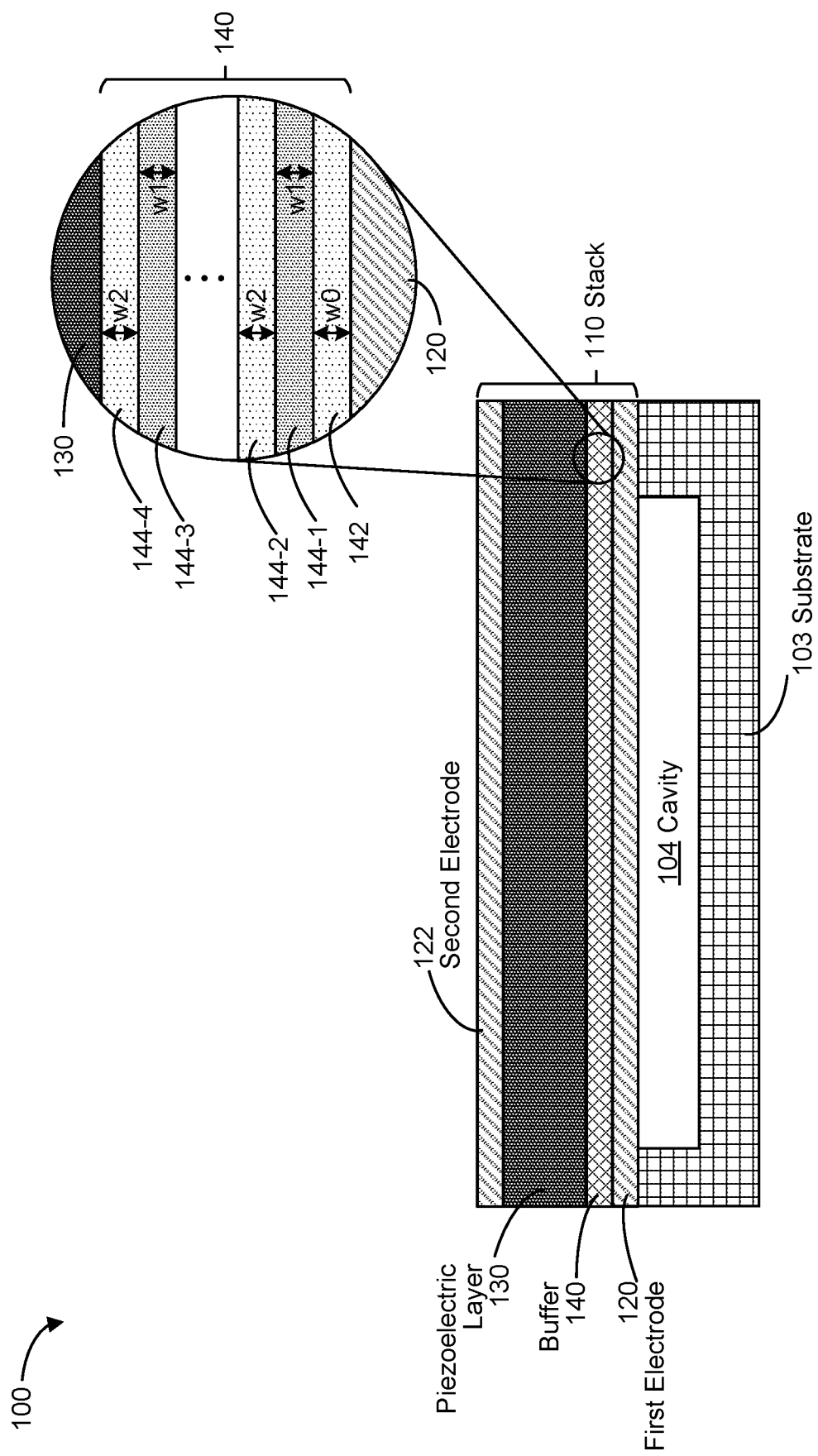
FIGS. 1A-1E are cross-sectional diagrams of bulk acoustic wave resonators, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices with structures for improved performance and manufacturability.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

FIGS. 1A-1E are cross-sectional diagrams of a bulk acoustic wave (BAW) resonator 100, in accordance with some embodiments. The resonator 100 includes a substrate 103 (e.g., silicon, glass, sapphire, ceramic, gallium arsenide and/or silicon carbide), a cavity 104, and a stack 110 that is disposed over the substrate 103 and the cavity 104. The stack 110 includes a first electrode 120 (e.g., molybdenum, aluminum, and/or tungsten), a multilayer buffer 140, a piezoelectric layer 130, and a second electrode 122 (e.g., molybdenum, aluminum, and/or tungsten). The multilayer buffer 140 is disposed over the first electrode 120 and between the first electrode 120 and the piezoelectric layer 130. The piezoelectric layer 130 is disposed over the multilayer buffer 140 and between the multilayer buffer 140 and the second electrode 122.

In some embodiments, as shown in FIG. 1A, the cavity 104 is supported by and at least partially surrounded by the substrate 103. In such cases, the stack 110 is disposed over the cavity 104 and supported by the substrate 103. In some embodiments, the stack 110 is directly coupled to the substrate 103. In some embodiments, the first electrode 120, which is a bottom layer of the stack 110, is directly coupled to the substrate 103.

Figure 1B:
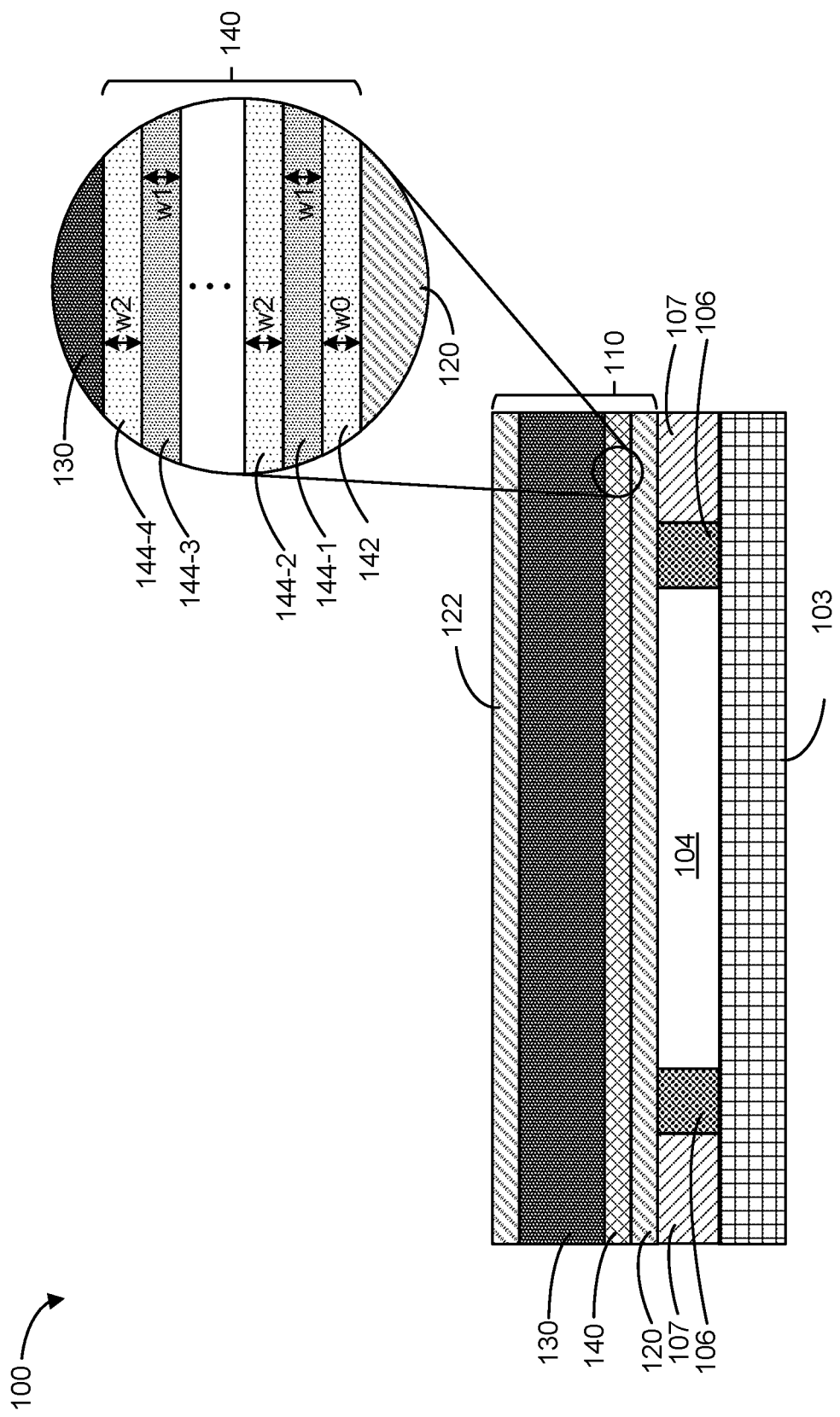

In some embodiments, as shown in FIG. 1B, the BAW resonator 100 further includes a frame 106 (e.g., cavity frame) that is disposed over the substrate 103. The cavity 104 is supported by and is at least partially surrounded by the frame 106. In some embodiments, frame 106 is formed from or includes a material with high thermal conductivity (e.g., aluminum, gold, copper, silver, or diamond) and/or high electrical conductivity (e.g., aluminum, gold, copper, or silver). In some embodiments, the frame 106 is surrounded by a planarizing material 107, which forms a perimeter around the frame 106, so as to present a flat surface on which the stack 110 is to be formed and to ensure a high degree of structural integrity in the portion of the BAW resonator 100 that supports the stack suspended over the cavity 104. In some embodiments, planarizing material 107 is a dielectric material, such as polysilicon; in some embodiments, planarizing material 107 is the same as or similar to substrate 103 in composition. In embodiments in which the BAW resonator includes a frame 106, the stack 110 is disposed over the cavity 104 and supported by the frame 106. In some embodiments, the stack 110 is directly coupled to the frame 106. In some embodiments, the first electrode 120, which is a bottom layer of the stack 110, is directly coupled to the frame 106.

The multilayer buffer 140 includes two or more pairs of alternating layers, and each pair of the two or more pairs of alternating layers includes a layer of crystalline material having a first lattice constant and another layer of crystalline material having a lattice constant that is distinct (e.g., different) from the first lattice constant. For example, a first pair of the two or more pairs of alternating layers includes a first layer 144-1 and a second layer 144-2. The first layer 144-1 includes (e.g., is composed of) aluminum nitride (AlN), and the second layer 144-2 includes (e.g., is composed of) scandium aluminum nitride ($Sc_xAl_{1-x}N$).

In some embodiments, the concentration of Sc in the second layer 144-2 is between 0.5% and 30% such that the value of x is between 0.005 and 0.3 (e.g., $0.005 \leq x \leq 0.3$). In some embodiments, the first layer 144-1 is disposed between the first electrode 120 and the second layer 144-2. In some embodiments, the second layer 144-2 is disposed over the first layer 144-1 and between the first layer 144-1 and the piezoelectric layer 130.

In some embodiments, the first layer 144-1 has a first thickness w1, and the second layer 144-2 has a second thickness w2. In some embodiments, the first thickness is equal to the second thickness (e.g., w1=w2). In some embodiments, the first thickness is different from the second thickness (e.g., w1≠w2). In some embodiments, each of the first layer 144-1 and the second layer 144-2 of the multilayer buffer 140 is between 10 to 1000 Angstroms in thickness (e.g., 10 Angstroms≤w1≤1000 Angstroms, and 10 Angstroms≤w2≤1000 Angstroms).

In some embodiments, the multilayer buffer 140 includes a second pair of the two or more pairs of alternating layers. The second pair of the two or more pairs of alternating layers includes a third layer 144-3 and a fourth layer 144-4. The third layer 144-3 includes (e.g., is composed of) a crystalline material having the first lattice constant, and the fourth layer 144-4 includes (e.g., is composed of) a crystalline material having a lattice constant that is different from the first lattice constant. In some embodiments, the third layer 144-3 includes aluminum nitride (AlN), and the fourth layer 144-4 includes scandium aluminum nitride ($Sc_xAl_{1-x}N$). In some embodiments, the third layer 144-3 is disposed between the second layer 144-2 and the fourth layer 144-2. In some embodiments, the fourth layer 144-4 is disposed over the third layer 144-3 and between the third layer 144-3 and the piezoelectric layer 130. In some embodiments, the fourth layer 144-4 is a top layer of the multilayer buffer 140, and the fourth layer 144-4 is adjacent to and coupled (e.g., directly coupled) to the piezoelectric material 130.

In some embodiments, the third layer 144-3 has the first thickness w1 (e.g., has a same thickness as the first layer 144-1), and the fourth layer 144-4 has the second thickness w2 (e.g., has a same thickness as the second layer 144-2).

In some embodiments, the second layer 144-2 and the fourth layer 144-4 both have a same second lattice constant that is different from the first lattice constant, and thus the second layer 144-2 and the fourth layer 144-4 have a same concentration of Sc (e.g., x=x'). In some embodiments, the fourth layer 144-4 has a lattice constant that is different from the second lattice constant of the second layer 144-2 such that a concentration of Sc in the fourth layer 144-4 is different from a concentration of Sc in the second layer 144-2 (e.g., x and x' have different values). In some embodiments, the concentration of Sc in the fourth layer 144-4 is higher than a concentration of Sc in the second layer 144-2 (e.g., x'>x). In some embodiments, the concentration of Sc in the fourth layer 144-4 is between 0.5% and 30% such that the value of x' is between 0.005 and 0.3 (e.g., $0.005 \leq x' \leq 0.3$).

In some embodiments, the multilayer buffer 140 includes one or more additional pairs of alternating layers between the first pair of alternating layers and the second pair of alternating layers. Each additional pair of alternating layers includes a layer (sometimes herein called a fifth layer for ease of reference) of crystalline material having the first lattice constant and another layer (sometimes herein called a sixth layer for ease of reference) of crystalline material having a lattice constant that is different from the first lattice constant. In some embodiments, the sixth layer of crystalline material of each additional pair of alternating layers has the second lattice constant such that the sixth layer of crystalline material of each additional pair of alternating layers, the second layer 144-2 of crystalline material, and the fourth layer 144-4 of crystalline material have a same concentration of Sc. Alternatively, the sixth layer of crystalline material of each additional pair of alternating layers has a lattice constant that differs from the second lattice constant of the second layer 144-2 of crystalline material and differs from the lattice constant of the fourth layer 144-4 of crystalline material. For example, the sixth layer of crystalline material may have a concentration of Sc that is between x and x'. In some embodiments, the concentration of Sc in each pair of alternating layers increases monotonically with each successive layer such that the fourth layer 144-4 of crystalline material has a highest concentration of Sc relative to other layers of scandium aluminum nitride in the multilayer buffer 140. In some embodiments, the fifth layer of each additional pair of alternating layers has the first thickness w1 (e.g., has a same thickness as the first layer 144-1 and the third layer 144-3), and the sixth layer of each additional pair of alternating layers has the second thickness w2 (e.g., has a same thickness as the second layer 144-2 and the fourth layer 144-4).

It is to be understood that all references to a "same thickness" means thicknesses that are the same within a first predefined tolerance, where the first predefined tolerance, such as five percent (5%) or ten percent (10%), is generally twenty percent or less. Similarly, it is to be understood that all references to a same lattice constant or a same concentration of Sc means lattice constants, or concentrations, within a second predefined tolerance, where the second predefined tolerance, such as five percent (5%) or ten percent (10%), is generally ten percent or less.

In some embodiments, the two or more pairs of alternating layers in the multilayer buffer 140 (e.g., layers 144-1 through 144-4, and any additional layers) form a superlattice.

In some embodiments, each layer of the multilayer buffer 140 is between 10 to 1000 Angstroms in thickness.

In some embodiments, the multilayer buffer 140 also includes a base layer 142 of crystalline material that is disposed between the first electrode 120 and the first layer 144-1 of crystalline material. For example, the base layer 142 is adjacent to and coupled (e.g., directly coupled) to each of the first electrode 120 and the first layer 144-1 of crystalline material. The base layer 142 has a lattice constant that is different from the first lattice constant. In some embodiments, the base layer 142 has a lattice constant that is the same a lattice constant of the second layer 144-2 of crystalline material and the fourth layer 144-4 of crystalline material. In some embodiments, the base layer 142 includes (e.g., is composed of) scandium aluminum nitride (ScAlN).

The base layer 142 has a thickness 10. In some embodiments, the thickness w0 of the base layer 142 is the same as the thickness of the second layer 144-2 (e.g., w0=w2).

The piezoelectric layer 130 includes (e.g., is composed of) scandium aluminum nitride ($Sc_yAl_{1-y}N$). In some embodiments, the concentration of Sc in the piezoelectric layer 130 is between 0.5% and 30% such that the value of y is between 0.005 and 0.3. In some embodiments, the piezoelectric layer 130 has a concentration of Sc that is equal to or greater than the concentration of Sc in the fourth layer 144-4 of the multilayer buffer 140 (e.g., y>x'). In some embodiments, a high concentration of Sc (e.g., high composition of Sc) in the piezoelectric layer 130 allows the BAW resonator 100 to have a high coupling coefficient (Ksq). In general, the coupling coefficient (Ksq) of the BAW resonator 100 increases with increasing Sc concentration.

In some embodiments, such as when the piezoelectric layer 130 includes (e.g., is composed of) scandium aluminum nitride ($Sc_yAl_{1-y}N$) with a high concentration of Sc (e.g., high composition of Sc), inclusion of the multilayer buffer 140 between the first electrode 120 and the piezoelectric layer 130 improves the crystalline quality of the piezoelectric layer 130 compared to direct deposition of the piezoelectric layer 130 on the first electrode 120. Additionally, the inclusion of the multilayer buffer 140 allows good crystalline quality of straight, uniform, and high Sc concentration scandium aluminum nitride ($Sc_yAl_{1-y}N$) to be formed as the piezoelectric layer 130. Additionally, the inclusion of the multilayer buffer 140 results in a higher coupling coefficient (Ksq) for the BAW resonator 100 relative to BAW resonators that do not include a buffer layer or include a single layer buffer (e.g., a single layer of AlN) disposed between the first electrode 120 and the piezoelectric layer 130.

Figure 1C:
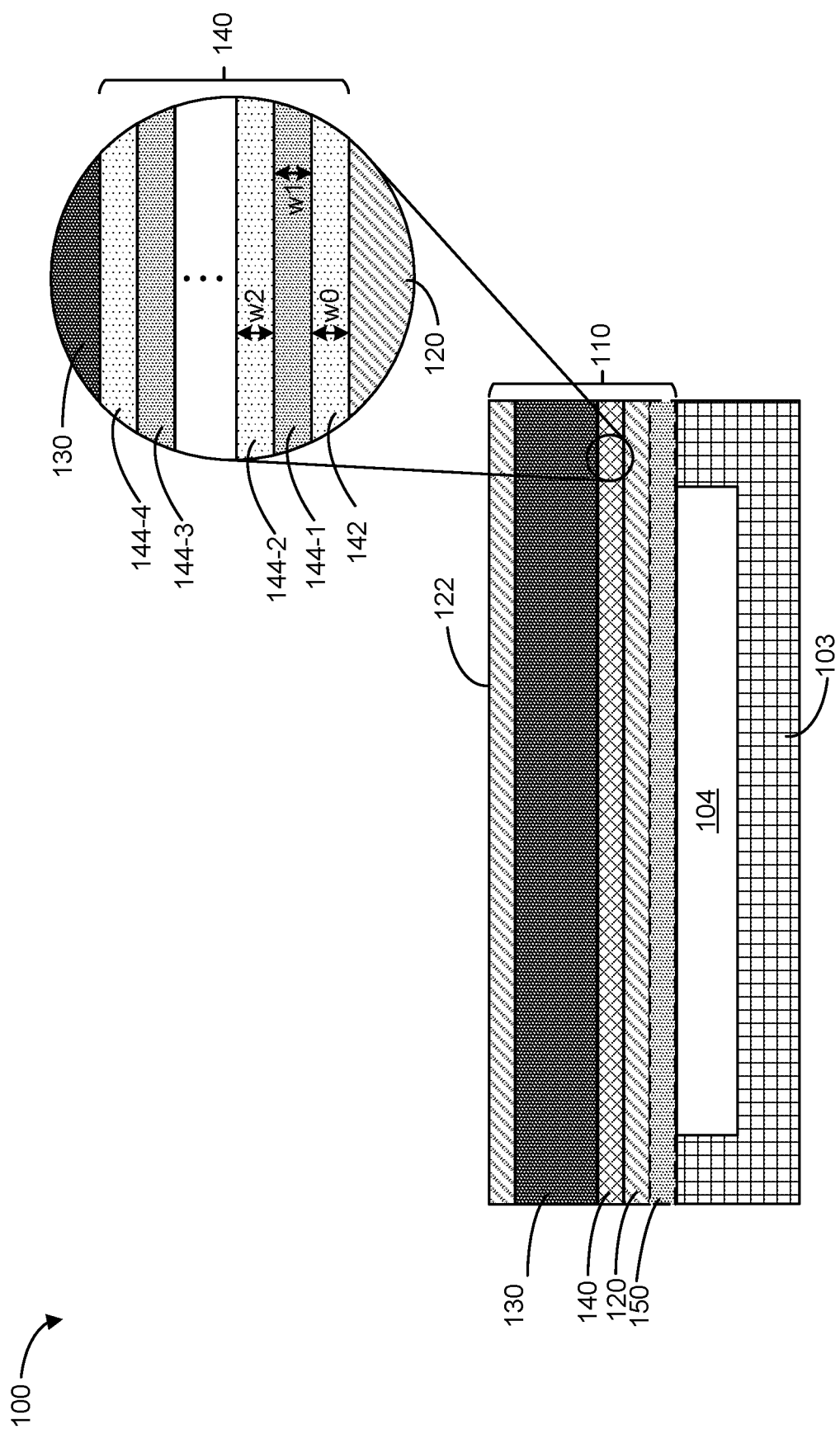
Figure 1D:
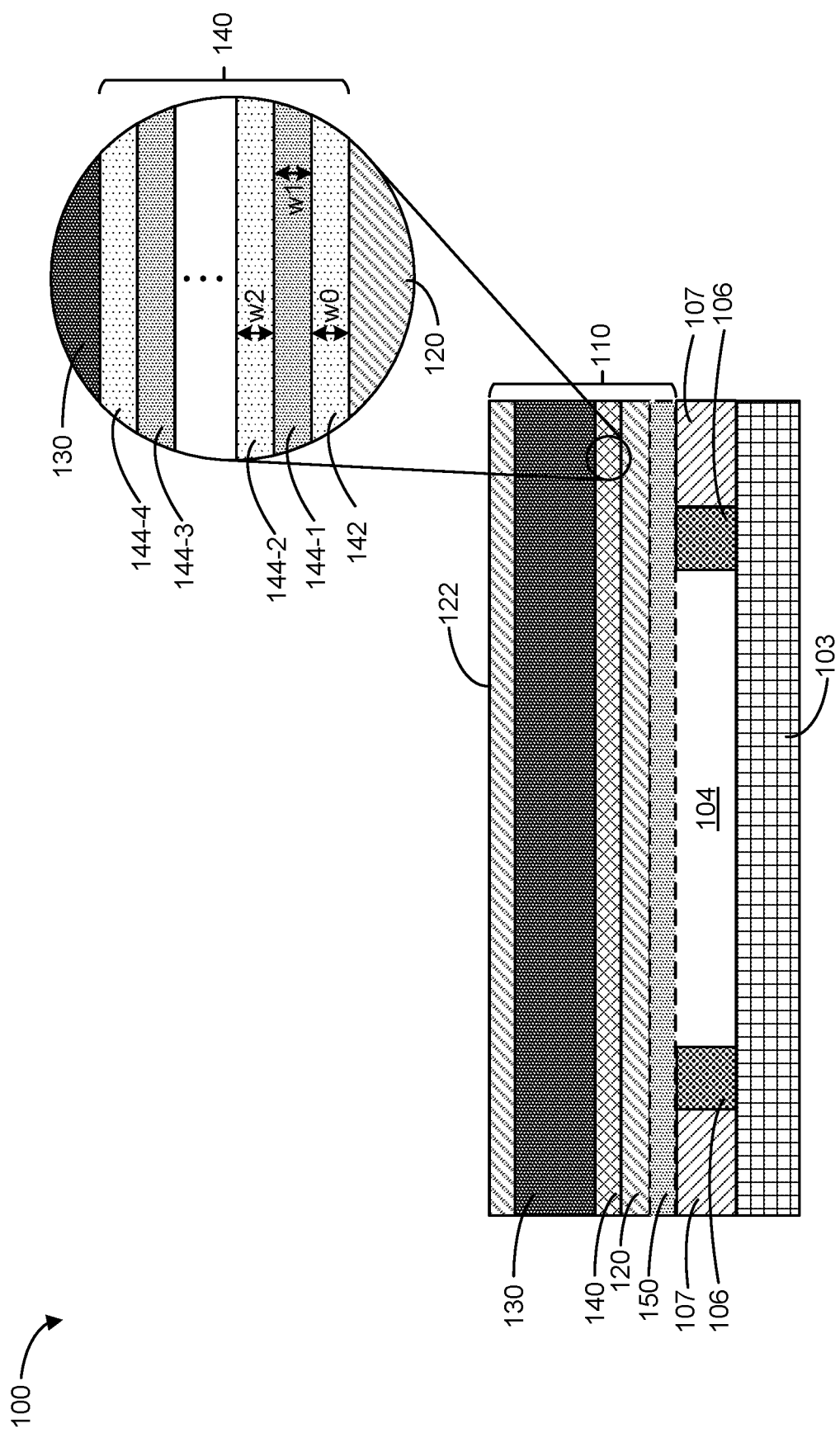
Figure 1E:
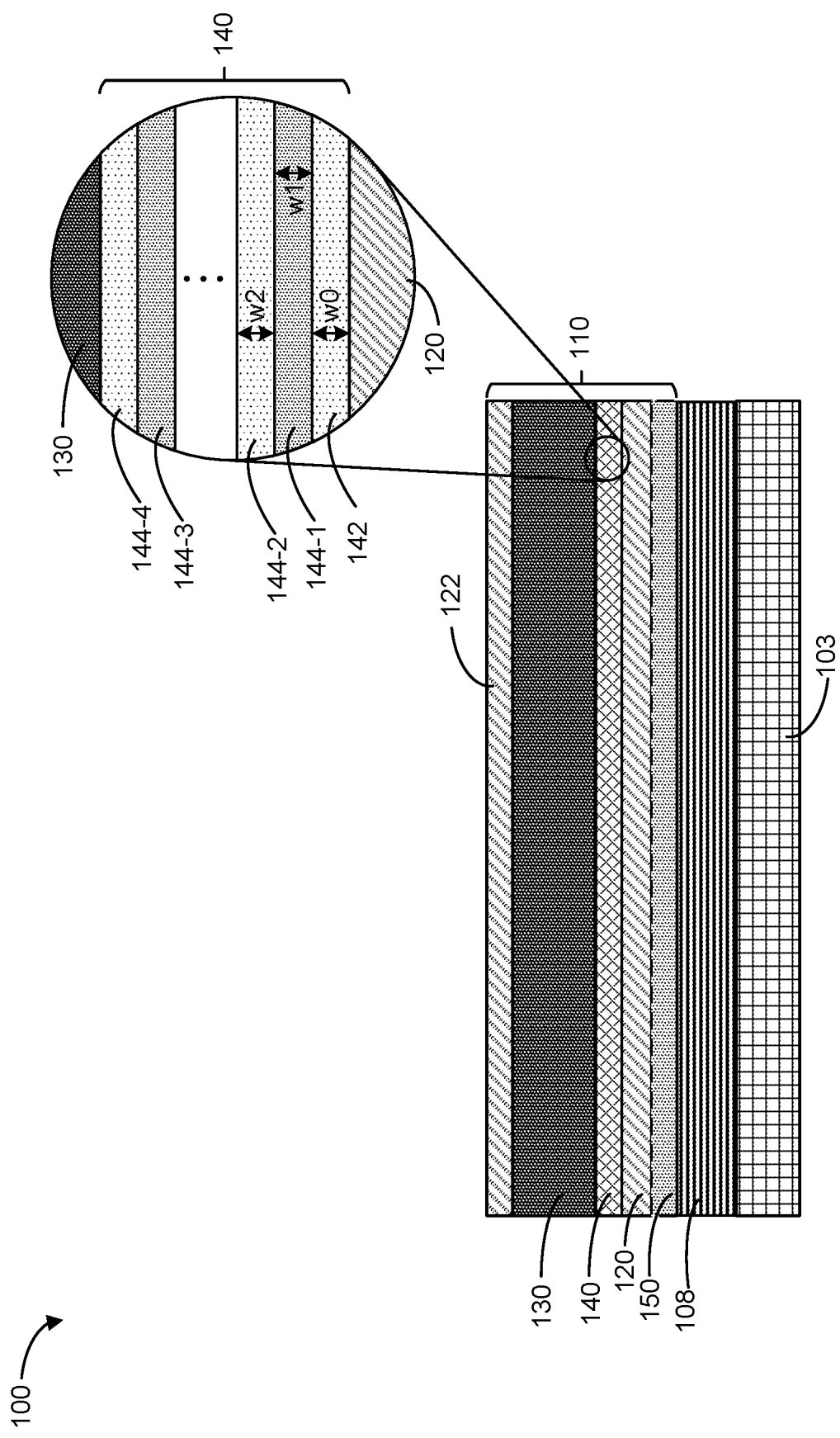

In some embodiments, as shown in FIG. 1C, the stack 110 includes an optional seed layer 150 that is directly coupled to the substrate 103 such that the seed layer 150 is adjacent to the cavity 104 (or, as shown in FIG. 1E, adjacent to an acoustic reflector 108, in embodiments in which an acoustic reflector is used instead of cavity 104), and the first electrode 120 (e.g., the seed layer 150 is disposed between the cavity 104 (or acoustic reflector 108) and the first electrode 120).

In some embodiments, as shown in FIG. 1D, the stack 110 includes an optional seed layer 150 that is directly coupled to the frame 106 such that the seed layer 150 is adjacent to the cavity 104 and the first electrode 120 (e.g., the seed layer 150 is disposed between the cavity 104 and the first electrode 120).

In some embodiments, the seed layer 150 is a single layer of a crystalline material. For example, the seed layer 150 is a single layer of aluminum nitride (AlN). In another example, the seed layer 150 is a single layer of scandium aluminum nitride ($Sc_jAl_{1-j}N$).

Figure 2:
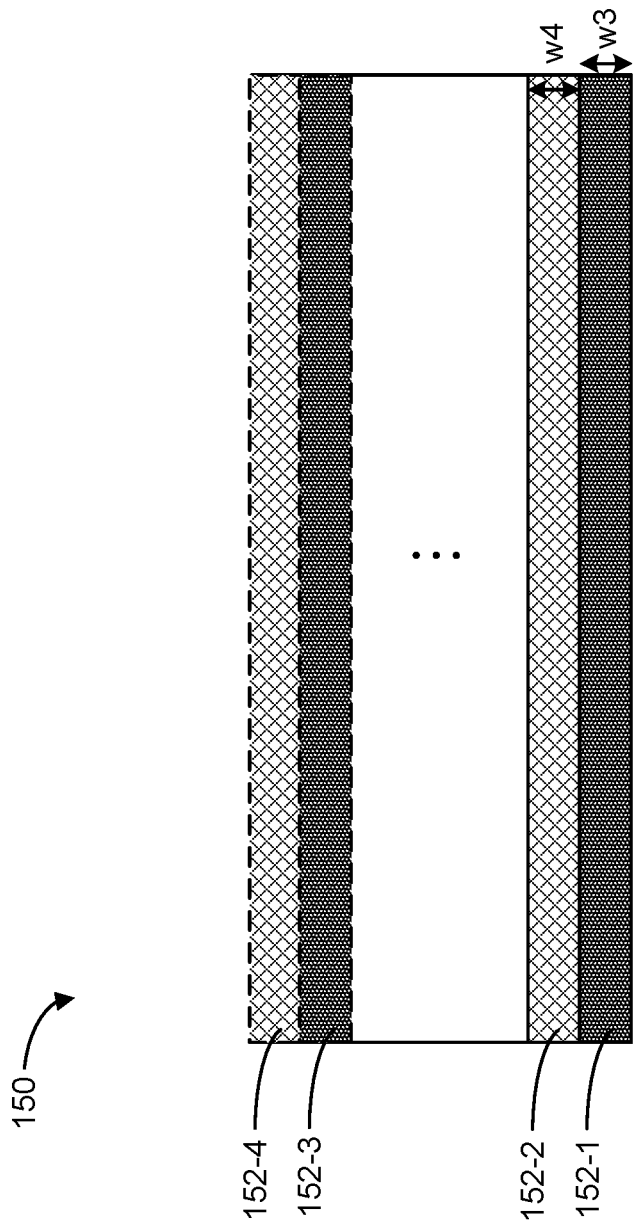
FIG. 2 is a cross-sectional diagram illustrating an example of a seed layer for a bulk acoustic resonator, in accordance with some embodiments.

In some embodiments, as shown in FIG. 2, the seed layer 150 includes alternating sublayers of a crystalline material (e.g., a first crystalline material) having the first lattice constant and a crystalline material (e.g., a second crystalline material) having a lattice constant that is different from the first lattice constant. For example, the seed layer 150 includes a first sublayer 152-1 that includes (e.g., is composed of) aluminum nitride (AlN), and a second sublayer 152-2 that includes (e.g., is composed of) scandium aluminum nitride ($Sc_jAl_{1-j}N$). In some embodiments, the seed layer 150 also includes a third sublayer 152-3 that includes (e.g., is composed of) aluminum nitride (AlN), and a fourth sublayer 152-4 that includes (e.g., is composed of) scandium aluminum nitride ($Sc_{j'}Al_{1-j'}N$). The third sublayer 152-3 is disposed between the second sublayer 152-2 and the fourth sublayer 152-4. In some embodiments, the fourth sublayer 152-4 has a same lattice constant as the second sublayer 152-2 such that the second sublayer 152-2 and the fourth sublayer 152-4 have a same concentration of Sc (e.g., j=j'). In some embodiments, the fourth sublayer 152-4 has a lattice constant that is different from the lattice constant of the second sublayer 152-2 such that a concentration of Sc in the fourth sublayer 152-4 is different from a concentration of Sc in the second sublayer 152-2 (e.g., j≠j') In some embodiments, the concentration of Sc in the fourth sublayer 152-4 is higher than a concentration of Sc in the second sublayer 152-2 (e.g., j<j'). In some embodiments, the concentration of Sc in the second sublayer 152-2 is between 0.5% and 30% such that the value of j is between 0.005 and 0.3 (e.g., 0.005≤j≤0.3). In some embodiments, the concentration of Sc in the fourth sublayer 152-4 is between 0.5% and 30% such that the value of j' is between 0.005 and 0.3 (e.g., 0.005≤j'≤0.3).

In another example, the first sublayer 152-1 of the seed layer 150 includes (e.g., is composed of) scandium aluminum nitride ($Sc_jAl_{1-j}N$), and the second sublayer 152-2 includes (e.g., is composed of) aluminum nitride (AlN). In some embodiments, the seed layer 150 also includes a third sublayer 152-3 that includes (e.g., is composed of) scandium aluminum nitride ($Sc_{j'}Al_{1-j'}N$), and a fourth sublayer 152-4 that includes (e.g., is composed of) aluminum nitride (AlN). The third sublayer 152-3 is disposed between the second sublayer 152-2 and the fourth sublayer 152-4. In some embodiments, the third sublayer 152-3 has a same lattice constant as the first sublayer 152-1 such that the first sublayer 152-1 and the third sublayer 152-3 have a same concentration of Sc (e.g., j=j'). In some embodiments, the third sublayer 152-3 has a lattice constant that is different from the lattice constant of the first sublayer 152-1 such that a concentration of Sc in the third sublayer 152-3 is different from a concentration of Sc in the first sublayer 152-1 (e.g., j≠j'). In some embodiments, the concentration of Sc in the third sublayer 152-3 is higher than a concentration of Sc in the first sublayer 152-1 (e.g., j<j'). In some embodiments, the concentration of Sc in the first sublayer 152-1 is between 0.5% and 30% such that the value of j is between 0.005 and 0.3 (e.g., 0.005≤j≤0.3). In some embodiments, the concentration of Sc in the third sublayer 152-3 is between 0.5% and 30% such that the value of j' is between 0.005 and 0.3 (e.g., 0.005≤j'≤0.3).

In some embodiments, the concentration of Sc in the seed layer, or in each sublayer of the seed layer that includes Sc, is between 0.5% and 30% (e.g., 0.005≤j, j'≤0.3).

In some embodiments, the first sublayer 152-1 of the seed layer 150 is a bottom of the seed layer 150 that is adjacent to the cavity 104 (or acoustic reflector 108, FIG. 1E).

In some embodiments, the fourth sublayer 152-4 of the seed layer 150 is a top of the seed layer 150 and is adjacent to and coupled to the first electrode 120.

In some embodiments, the first sublayer 152-1 of the seed layer 150 has a third thickness w3, and the second sublayer 152-2 of the seed layer 150 has a fourth thickness w4. In some embodiments, the third thickness is equal to the fourth thickness (e.g., w3=w4). In some embodiments, the third thickness is different from the fourth thickness (e.g., w3≠w4).

In some embodiments, the third sublayer 152-3 of the seed layer 150 has the third thickness w3 (e.g., has a same thickness as the first sublayer 152-1), and the fourth sublayer 152-4 has the fourth thickness w4 (e.g., has a same thickness as the second sublayer 152-2).

In some embodiments, the seed layer 150 includes additional alternating sublayers between the second sublayer 152-2 and the third sublayer 152-3, such as one or more additional pairs of sublayers, each pair including a sublayer that includes (e.g., is composed of) aluminum nitride (AlN) and another sublayer that includes (e.g., is composed of) scandium aluminum nitride (ScAlN).

In some embodiments, each sublayer of the seed layer 150 that includes the scandium aluminum nitride (ScAlN) has a same concentration of Sc. In some embodiments, the concentration of Sc in sublayers of the seed layer 150 that include scandium aluminum nitride (ScAlN) increases monotonically with each successive layer such that the fourth sublayer 152-4 of the seed layer 150 has a highest concentration of Sc relative to other layers of scandium aluminum nitride in the seed layer 150. In some embodiments, other arrangements of Sc concentrations are present in sublayers of the seed layer 150. For example, a sublayer of the seed layer 150 that includes scandium aluminum nitride (ScAlN) may have a concentration of Sc that is the same as or different from another sublayer of the seed layer 150 that includes the scandium aluminum nitride (ScAlN).

In some embodiments, the seed layer 150 includes as few as one sublayer (e.g., a single layer seed layer 150). In some embodiments, the seed layer 150 includes a plurality of sublayers. In some embodiments, the seed layer 150 includes as many as 99 sublayers.

In some embodiments, e.g., as shown in FIG. 1E, the cavity 104 is replaced by an acoustic reflector 108. In such embodiments, the BAW resonator 100 includes the substrate 103, an acoustic reflector 108 arranged over the substrate 103, the piezoelectric layer 130, and the first and second electrodes 120, 122. The first electrode 120 is arranged between the acoustic reflector 108 and the piezoelectric layer 130, and the second electrode 122 is arranged along a portion of an upper surface of the piezoelectric layer 130. An area in which the piezoelectric layer 130 is arranged between overlapping portions of the first electrode 120 and the second electrode 122 is considered the active region of the resonator device 100. The acoustic reflector 108 is positioned between the substrate 103 and first electrode 120 (e.g., below the first electrode 120 and, if included in the BAW resonator 100, the seed layer 150), and reflects acoustic waves and thereby reduces or avoids their dissipation in the substrate 103. In some embodiments, the acoustic reflector 108 is a multilayer acoustic mirror that includes alternating layers of materials (e.g., SiOC, $Si_3N_4$, $SiO_2$, AlN, or Mo) of different acoustic impedances, optionally embodied in a Bragg mirror, deposited over the substrate 103. Inclusion of seed layer 150 in such BAW resonators is optional.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A bulk acoustic resonator, comprising:
a substrate; and
a stack supported by the substrate, the stack including:
   a first electrode;
   a multilayer buffer having two or more pairs of alternating layers, a first pair of the two or more pairs including:
      a first layer of crystalline material having a first lattice constant; and
      a second layer of crystalline material having a lattice constant that is distinct from the first lattice constant;
   a piezoelectric layer; and
   a second electrode, wherein:
      the multilayer buffer is disposed between the first electrode and the piezoelectric layer; and
      the piezoelectric layer is disposed between the multilayer buffer and the second electrode.

2. The bulk acoustic resonator of claim 1, wherein:
a second pair of the two or more pairs in the multilayer buffer include a third layer of crystalline material having the first lattice constant and a fourth layer of crystalline material having a lattice constant that is different from the first lattice constant;
the second layer of crystalline material is disposed between the first layer of crystalline material and the third layer of crystalline material; and
the third layer of crystalline material is disposed between the second layer of crystalline material and the fourth layer of crystalline material.

3. The bulk acoustic resonator of claim 2, wherein the second layer of crystalline material and the fourth layer of crystalline material have a same lattice constant.

4. The bulk acoustic resonator of claim 2, wherein the multilayer buffer further includes additional pairs of alternating layers of crystalline materials.

5. The bulk acoustic resonator of claim 2, wherein the first layer of crystalline material is disposed between the first electrode and the second layer of crystalline material.

6. The bulk acoustic resonator of claim 2, wherein the fourth layer of the multilayer buffer is coupled to the piezoelectric layer.

7. The bulk acoustic resonator of claim 2, wherein:
the multilayer buffer further includes a base layer of crystalline material that is disposed between the first electrode and the first layer of crystalline material; and
the base layer of the multilayer buffer has a lattice constant that is different from the first lattice constant.

8. The bulk acoustic resonator of claim 7, wherein:
the base layer of crystalline material, the second layer of crystalline material, and the fourth layer of crystalline material have a same lattice constant.

9. The bulk acoustic resonator of claim 7, wherein:
the base layer of crystalline material includes scandium aluminum nitride ($Sc_xAl_{1-x}N$).

10. The bulk acoustic resonator of claim 2, wherein in the multilayer buffer:
the first layer of crystalline material includes aluminum nitride (AlN); and
the second layer of crystalline material includes scandium aluminum nitride ($Sc_xAl_{1-x}N$).

11. The bulk acoustic resonator of claim 10, wherein in the multilayer buffer:
the third layer of crystalline material includes aluminum nitride (AlN); and
the fourth layer of crystalline material includes scandium aluminum nitride ($Sc_{x'}Al_{1-x'}N$).

12. The bulk acoustic resonator of claim 11, wherein both x and x' have values between 0.005 and 0.3.

13. The bulk acoustic resonator of claim 11, wherein x' is larger than x, and the fourth layer of crystalline material is a top layer of the multilayer buffer that is in contact with the piezoelectric layer.

14. The bulk acoustic resonator of claim 2, wherein the piezoelectric layer includes scandium aluminum nitride ($Sc_yAl_{1-y}N$) with an equal or higher concentration of scandium than the fourth layer of crystalline material in the multilayer buffer.

15. The bulk acoustic resonator of claim 14, wherein y has a value between 0.005 and 0.3.

16. The bulk acoustic resonator of claim 1, wherein the alternating layers of crystalline material form a superlattice.

17. The bulk acoustic resonator of claim 1, wherein each of the first layer of crystalline material and the second layer of crystalline material is 10 to 1000 Angstroms in thickness.

18. The bulk acoustic resonator of claim 1, wherein in the multilayer buffer:
the first layer of crystalline material has a first thickness and the second layer of crystalline material has a second thickness that is different from the first thickness.

19. The bulk acoustic resonator of claim 1, wherein the stack further includes a seed layer disposed between the first electrode and the substrate, and adjacent to the first electrode.

20. The bulk acoustic resonator of claim 19, wherein the seed layer includes scandium aluminum nitride (ScAlN).

21. The bulk acoustic resonator of claim 19, wherein the seed layer includes aluminum nitride (AlN).

22. The bulk acoustic resonator of claim 19, wherein the seed layer includes alternating sublayers of a crystalline material having the first lattice constant and a crystalline material having a lattice constant different from the first lattice constant.

23. The bulk acoustic resonator of claim 22, wherein the seed layer includes:
a first sub-layer of the seed layer includes aluminum nitride (AlN); and
a second sub-layer includes scandium aluminum nitride ($Sc_jAl_{1-j}N$).

24. The bulk acoustic resonator of claim 1, wherein substrate includes a cavity that is supported by and at least partially surrounded by a frame, and the stack is directly coupled to the frame.

25. The bulk acoustic resonator of claim 1, wherein the stack is directly coupled to the substrate.

26. The bulk acoustic resonator of claim 1, including an acoustic reflector supported by the substrate, wherein the stack is supported by the acoustic reflector.

27. The bulk acoustic resonator of claim 26, wherein the acoustic reflector is a multilayer acoustic mirror.

28. The bulk acoustic resonator of claim 1, wherein the piezoelectric layer includes ScAlN.

* * * * *